(12) United States Patent
Leyh et al.

(10) Patent No.: US 12,719,451 B2
(45) Date of Patent: Aug. 25, 2026

(54) DIGITAL FILTER CIRCUIT HAVING A NUMBER OF CONVOLUTION SUB-CIRCUITS

(71) Applicant: Rohde & Schwarz GmbH & Co. KG, Munich (DE)

(72) Inventors: Julian Leyh, Munich (DE); Michael Vonbun, Munich (DE); Andreas Oeldemann, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 1229 days.

(21) Appl. No.: 17/671,848

(22) Filed: Feb. 15, 2022

(65) Prior Publication Data

US 2023/0179180 A1 Jun. 8, 2023

Related U.S. Application Data

(63) Continuation-in-part of application No. 17/540,729, filed on Dec. 2, 2021.

(51) Int. Cl.
*H03H 17/06* (2006.01)
*H03H 17/00* (2006.01)

(52) U.S. Cl.
CPC ..... *H03H 17/06* (2013.01); *H03H 2017/0081* (2013.01)

(58) Field of Classification Search
CPC ............... H03H 17/06; H03H 17/0294; H03H 17/0225; H03H 17/0223; H03H 17/0275; H03H 21/0012; H03H 2017/0247; H03H 2017/0081; H03H 2218/06; H03H 2218/10; H03H 15/00; H03H 15/023;
(Continued)

(56) References Cited

U.S. PATENT DOCUMENTS 9,098,435 B1 8/2015 Nelson et al.
10,749,541 B1 8/2020 Stein et al.
(Continued)

FOREIGN PATENT DOCUMENTS

CN 106936406 A 7/2017

OTHER PUBLICATIONS

Z. Mou et al., "A Unified Approach to the Fast FIR Filtering Algorithms", 1988. (Year: 1988).*
(Continued)

*Primary Examiner* — James Trujillo
*Assistant Examiner* — Maria De Jesus Rivera
(74) *Attorney, Agent, or Firm* — CHRISTENSEN O'CONNOR JOHNSON KINDNESS PLLC

(57) ABSTRACT

A digital filter circuit is described. The digital filter circuit includes a pre-adder circuit, a convolution circuit, and a post-adder circuit. The pre-adder circuit includes a number of n pre-adder sub-circuits, wherein n is an integer greater than or equal to 2. The convolution circuit includes a number of m convolution sub-circuits, wherein m is an integer. The post-adder circuit includes a number of k post-adder sub-circuits, wherein k is an integer greater than or equal to 2. The number m of convolution sub-circuits is greater than the number n of pre-adder sub-circuits of the pre-adder circuit. The number m of convolution sub-circuits is greater than the number k of post-adder sub-circuits of the post-adder circuit. Further, an electronic device is described.

19 Claims, 5 Drawing Sheets

(58) Field of Classification Search
CPC ............. G01R 31/31922; G06F 9/3885; G06F 9/3001; G06F 9/30014; G06F 9/3851; G06F 9/30112; G06F 9/3893; G06F 9/30149; G06F 9/30087; G06F 17/15; G06F 8/443
See application file for complete search history.

(56) References Cited

U.S. PATENT DOCUMENTS

| | | | | |
|---|---|---|---|---|
| 11,894,821 | B2 | 2/2024 | Skinner et al. | |
| 2008/0018511 | A1 | 1/2008 | Leonard et al. | |
| 2008/0170533 | A1 | 7/2008 | Czys et al. | |
| 2016/0079960 | A1 | 3/2016 | Berscheid et al. | |
| 2017/0257234 | A1 | 9/2017 | Ali Shah et al. | |
| 2019/0043201 | A1 | 2/2019 | Strong et al. | |
| 2019/0087713 | A1 | 3/2019 | Lamb et al. | |
| 2021/0014609 | A1* | 1/2021 | Ishizuka | H04R 3/04 |
| 2022/0012856 | A1 | 1/2022 | Chen et al. | |
| 2022/0158752 | A1* | 5/2022 | Duthel | H04B 10/508 |

OTHER PUBLICATIONS

D. Wang et al., Block Fast FIR Algorithm and Circuit Design, 2021. (Year: 2021).*

D. Pavithra et al., "A Novel Fast FIR Algorithm for Area-Efficient Parallel FIR Digital Filter Structures Utilizes Symmetric Convolutions", 2014. (Year: 2014).*

B. Divya et al., "New Architecture of Parallel FIR Filter using Fast FIR Algorithm", Nov. 2012. (Year: 2012).*

Balla, P. et al., "Higher radix aperiodic-convolution algorithms," in IEEE Transactions on Acoustics, Speech, and Signal Processing, vol. 34, No. 1, pp. 60-68, Feb. 1986.

Mou, Zhi-Jian and P. Duhamel, "Short-Length FIR Filters and Their Use in Fast Nonrecursive Filtering," IEEE Transactions on Signal Processing, 39:6; Jun. 1991, 11 pages.

* cited by examiner 10
18
20
$H_{00}$
$H_{01}$
$H_{10}$
$H_{11}$
CH0
Electronic Device
CH0
Frontend
Crosstalk Filter
Processing
CH1
CH1
22
24
16
14
26
28
12
30

10
12
32
Electronic Device
Frontend
Time Interleaved
Sampling using at least
two ADCs
CH0
(ADC0 Polyphase)
Analog Input
ADC0
ADC1
Crosstalk Filter
Processing
34
CH1
(ADC1 Polyphase)
34
28
30

36 38 40 42 52 44 46 48 50 52

CH0 P PREADD $3\log_2 P$ CONV 00 $3\log_2 P$ POSTADD P CH0

PREADD CONV 01 POSTADD

PREADD CONV 10 POSTADD

CH1 P PREADD $3\log_2 P$ CONV 11 $3\log_2 P$ POSTADD P CH1

STATE OF THE ART 38
40
42
28
CH0
CH1
CH2
CH3
PREADD
PREADD
PREADD
PREADD
inactive
inactive
CONV 00
CONV 01
CONV 02
CONV 03
CONV 10
CONV 11
CONV 12
CONV 13
CONV 20
CONV 21
CONV 22
CONV 23
CONV 30
CONV 31
CONV 32
CONV 33
POSTADD
POSTADD
POSTADD
POSTADD
CH0
CH1
CH2
CH3
46
48
52
50

DIGITAL FILTER CIRCUIT HAVING A NUMBER OF CONVOLUTION SUB-CIRCUITS

CROSS-REFERENCE TO RELATED APPLICATION

This application is a continuation-in-part of U.S. patent application Ser. No. 17/540,729, filed on Dec. 2, 2021, the entire disclosure of which is hereby incorporated by reference.

FIELD OF THE DISCLOSURE

Embodiments of the present disclosure generally relate to a digital filter circuit. Embodiments of the present disclosure further relate to an electronic device.

BACKGROUND

Digital filters are known in a large variety in the state of the art. In general, digital filters are configured to process a digital signal, thereby altering the digital signal in a predefined manner depending on the filter coefficients of the digital filter.

With the data rates in many different applications, for example in signal analysis and signal generation, becoming higher and higher, the demands on the digital processing systems are on the rise as well.

Digital processing systems usually comprise several channels, such that several signals can be processed in parallel. Moreover, two or more channels may be used to process a single signal with higher precision, for example by a time-interleaved sampling technique.

However, the individual channels or different polyphases associated with a single channel may be inadvertently correlated with each other due to crosstalk between the channels or the different polyphases. A known way to mitigate the crosstalk are so-called crosstalk compensation filters, which filter the signals processed in the different channels or the different polyphases in order to reduce the crosstalk between the channels.

However, the complexity of such crosstalk compensation filters rises quadratically with the number of channels or with the number of different polyphases. Accordingly, crosstalk compensation filters become increasingly more expensive with higher number of channels.

Thus, there is a need for a digital filter circuit that is able to process digital signals having a high data rate and/or a high parallelism in a resource-efficient manner.

SUMMARY

Embodiments of the present disclosure provide a digital filter circuit. In an embodiment, the digital filter circuit comprises a pre-adder circuit, a convolution circuit, and a post-adder circuit. The pre-adder circuit comprises a number of n pre-adder sub-circuits, wherein n is an integer greater than or equal to 2. The convolution circuit comprises a number of m convolution sub-circuits, wherein m is an integer. The post-adder circuit comprises a number of k post-adder sub-circuits, wherein k is an integer greater than or equal to 2. The number m of convolution sub-circuits is greater than the number n of pre-adder sub-circuits of the pre-adder circuit. The number m of convolution sub-circuits is greater than the number k of post-adder sub-circuits of the post-adder circuit.

In general, the digital filter circuit is configured to receive and process a digital input signal set. In the context of the present disclosure, a signal set is understood to denote a single signal or a plurality of signals, wherein the number of signals comprised in the signal set corresponds to the number of channels of the signal set. Accordingly, the term "process a signal set" is understood to denote that each signal comprised in the respective signal set is processed.

In embodiments of the disclosure, the digital input signal set is processed by the pre-adder circuit, the convolution circuit, and the post-adder circuit, thereby generating a digital output signal set.

The digital output signal set may have the same number of digital signals as the digital input signal set, or a different number of digital signals compared to the digital input signal set.

The term "adder sub-circuit" is understood to denote a sub-circuit that is configured to add at least two signals.

The term "convolution sub-circuit" is understood to denote a sub-circuit that is configured to multiply at least one signal with a matrix that corresponds to the filter coefficients of the respective convolution sub-circuit. Accordingly, the convolution sub-circuits each may comprise at least one multiplier sub-circuit that is configured to multiply at least one signal with a matrix that corresponds to the filter coefficients of the respective convolution sub-circuit.

In some embodiments, the pre-adder circuit and/or the post-adder circuit may be free of multiplier sub-circuits.

In conventional digital filters, the number n of adder sub-circuits of the pre-adder circuit is equal to or greater than the number m of convolution sub-circuits. Likewise, in conventional digital filters, the number k of adder sub-circuits of the post-adder circuit is equal to or greater than the number m of convolution sub-circuits.

Accordingly, the number n of adder sub-circuits of the pre-adder circuit and the number k of adder sub-circuits of the post-adder circuit is smaller than in comparable digital filter circuits known in the prior art. Thus, less hardware resources, namely less adder sub-circuits, are necessary, thereby reducing the complexity and the costs of manufacturing the digital filter circuit.

In some embodiments, it has turned out that the number of necessary multiplier sub-circuits can be reduced by 50% or even more compared to digital filter circuits known from the state of the art.

Moreover, the number of necessary adder sub-circuits can be reduced by up to 70% or even more compared to conventional digital filter circuits known from the state of the art.

Embodiments of the digital filter circuit according to the present disclosure is based on the idea to provide a common pre- and post-processing by providing a modified architecture of the digital filter circuit.

The digital filter circuit may be configured such that recurring pre- and post-processing steps are performed jointly by the digital filter circuit. In other words, the pre-adder circuit is not dedicated to pre-processing only, but may also take over certain post-processing tasks. Likewise, the post-adder circuit is not dedicated to post-processing only, but may also take over certain pre-processing tasks.

This type of common pre- and post-processing allows for a reduced number of adder sub-circuits and/or for a reduced number of multiplier sub-circuits, such that less hardware resources are required and a highly resource-efficient digital filter circuit is provided.

According to an aspect of the present disclosure, the digital filter circuit is, for example, established as a finite impulse response (FIR) filter. In other words, the pre-adder circuit, the convolution circuit, and the post-adder circuit together establish the FIR filter. The FIR filter has a certain impulse response (i.e. certain filter coefficients) that determine how the FIR filter manipulates the digital input signal set in order to generate the digital output signal set.

According to another aspect of the present disclosure, the digital filter circuit is, for example, established as a short-length finite impulse response (SFIR) filter. SFIR filters are a particularly resource efficient filter type for processing signals having a high data rate and/or a high parallelism. Thus, a particularly resource-efficient digital filter circuit is provided.

Generally, a short-length FIR filter is a well-known type of FIR filter. Short-length FIR filters are based on short length FIR filtering algorithms that have a reduced complexity, thereby enabling a small delay processing, for example independent on the FIR filter length. In other words, short-length FIR filters have a reduced arithmetic complexity where all multiplications are replaced by decimated sub-filters. Typically, a short-length FIR filter has a filter length that is lower than several hundred. Concerning short-length FIR filters, reference is also made to Zhi-Jian Mou and Pierre Duhamel, "Short-Length FIR Filters and Their Use in Fast Nonrecursive Filtering" in IEEE TRANSACTIONS ON SIGNAL PROCESSING, VOL. 39, NO. 6, June 1991 or rather Prabhakara C. Balla, Andreas Antoniou and Salvatore D. Morgera, "Higher Radix Aperiodic-Convolution Algorithms" in IEEE TRANSACTIONS ON ACOUSTICS, SPEECH, AND SIGNAL PROCESSING, VOL. ASSP-34, NO. 1, February 1986.

In an embodiment of the present disclosure, the digital filter circuit is a crosstalk compensation filter. Accordingly, the digital filter circuit is configured to reduce or even eliminate crosstalk between at least two different channels processed by the digital filter circuit and/or crosstalk between at least two different polyphases processed by the digital filter circuit. Due to the modified architecture of the digital filter circuit according to embodiments of the present disclosure, a particularly resource-efficient crosstalk compensation filter is provided.

In a further embodiment of the present disclosure, m is greater than or equal to 4. In other words, the convolution circuit comprises at least four convolution sub-circuits. In general, the number of convolution sub-circuits may depend on the maximum number of channels or polyphases that are to be processed by the digital filter circuit. For example, the number of convolution sub-circuits may be equal to the number of channels to be processed squared and/or equal to the number of polyphases to be processed squared.

Another aspect of the present disclosure provides that the convolution sub-circuits are, for example, allocated to different sub-sets of convolution sub-circuits. In other words, each convolution sub-circuit may belong to a certain sub-set of convolution sub-circuits.

The individual sub-sets of convolution sub-circuits may be associated with certain channels to be processed, respectively. In other words, each sub-set may be associated with one or several channels that are processed by the respective sub-set of convolution sub-circuits.

In some embodiments, the different sub-sets may be activated and deactivated individually. For example, if all input channels of the digital filter circuit are active, all sub-sets may be activated such that all channels can be processed simultaneously, i.e. in parallel.

If, however, one or more input channels are inactive (e.g. because no signal is present in the respective channel), the corresponding sub-sets of convolution sub-circuits may be deactivated. This way, the power consumption of the digital filter circuit can be reduced. This is particularly advantageous if the digital filter circuit is used in a mobile electronic device, such as a mobile communication device.

In an embodiment of the present disclosure, a number of different sub-sets of convolution sub-circuits corresponds to a number of input channels to be processed. Accordingly, a sub-set of convolution sub-circuits is provided for each input channel.

In some embodiments, the digital filter circuit may have different operational modes depending on the parallelism of the digital input signal set, wherein the digital filter circuit may be switchable between the different operational modes.

In a first operational mode, when all input channels are active, all input channels can be processed in parallel by the different sub-sets of convolution sub-circuits, as described above.

In a second operational mode, when one or several input channels are inactive, i.e. the respective channels carry no signal to be processed, the respectively associated sub-sets of convolution sub-circuits may be switched off in order to reduce the power consumption of the digital filter circuit.

In a third operational mode, two or more sub-sets of convolution sub-circuits may cooperate in order to process at least one of the input channels with higher parallelism and/or with higher filter length of the digital filter circuit.

In other words, the number of channels may be reduced in exchange for an increased parallelism and/or in exchange for an increased filter length. This way, an enhanced accuracy is achieved for processing the reduced number of channels.

For example, the digital filter circuit comprises a connection circuit that is configured to selectively connect at least two different pre-adder sub-circuits, at least two different post-adder sub-circuits, and/or at least two different sub-sets of convolution sub-circuits based on the data parallelism of the digital input signal set, such that different sub-sets of convolution sub-circuits cooperate in processing at least one of the input channels.

In a fourth operational mode, a single sub-set of convolution sub-circuits may be configured to process two or more channels in a time-multiplexing mode. This is particularly advantageous if the digital input signal set has a rather low parallelism, such that the parallelism of the digital filter circuit is sufficient to process the digital input signal set in a time-multiplexing mode. In this case, one or more sub-sets of convolution sub-circuits may be deactivated, as described above.

In some embodiments, the convolution circuit comprises at least one adder sub-circuit, wherein the at least one adder sub-circuit is associated with at least two of the convolution sub-circuits. In general, the at least one adder sub-circuit is configured to add output signals of at least two of the convolution sub-circuits.

In the state of the art, the adder sub-circuits are usually provided downstream of the post-adder circuit, i.e. the adder sub-circuits sum output signals of the post-adder circuit.

According to embodiments of the present disclosure, the adder sub-circuits are shifted to the convolution circuit. Accordingly, recurring pre- and post-processing steps can be performed jointly by the digital filter circuit. In other words, the pre-adder circuit is not dedicated to pre-processing only, but may also take over certain post-processing tasks. Likewise, the post-adder circuit is not dedicated to post-processing only, but may also take over certain pre-processing tasks.

According to an aspect of the present disclosure, the at least one adder sub-circuit of the convolution circuit is, for example, interconnected between the at least two of the convolution sub-circuits associated with the at least one adder sub-circuit and the post-adder circuit. In other words, the at least one adder sub-circuit is provided downstream of the convolution sub-circuits, and upstream of the post-adder sub-circuits of the post-adder circuit.

According to a further aspect of the present disclosure, the at least one adder sub-circuit of the convolution circuit is, for example, configured to add output signals of the at least two of the convolution sub-circuits associated with the at least one adder sub-circuit. Thus, the output signals of the at least two of the convolution sub-circuits associated with the at least one adder sub-circuit are added upstream of the post-adder circuit, such that summed output signals of the convolution circuit are forwarded to the post-adder circuit. It has turned out that this allows for reducing the overall number of adder sub-circuits and/or the overall number of multiplier sub-circuits of the digital filter circuit.

In an embodiment of the present disclosure, the number m of convolution sub-circuits is equal to the number n of pre-adder sub-circuits of the pre-adder circuit squared, i.e. $m=n^2$. This way, it is ensured that enough convolution sub-circuits are provided to correctly process up to n different signals, i.e. up to n different channels.

In some embodiments, enough convolution sub-circuits are provided in order to remove crosstalk between n different signals, namely n signals of the digital input signal set.

In some embodiments, the number n of pre-adder sub-circuits of the pre-adder circuit may be equal to the maximum number of channels that can be processed by the digital filter circuit. Accordingly, a pre-adder sub-circuit may be provided for each input channel of the digital filter circuit.

Another aspect of the present disclosure provides that the number n of pre-adder sub-circuits of the pre-adder circuit is, for example, equal to the number k of post-adder sub-circuits of the post-adder circuit. As described above, the number n of pre-adder sub-circuits of the pre-adder circuit may be equal to the maximum number of channels that can be processed by the digital filter circuit. Accordingly, the maximum number of input signals of the digital filter matches the maximum number of output signals of the digital filter circuit.

The digital filter may be switchable between different configurations, wherein each configuration is associated with a predetermined number i of input channels to be processed and with a predetermined parallelism p, wherein i and p are integers. The different configurations may correspond to the different operational modes of the digital filter circuit described above.

In other words, the digital input signal set may be a i×p signal, wherein i is the number of channels and p is the data parallelism of the digital input signal set. Thus, i denotes the number of active channels, i.e. the number of signals that are processed in parallel by an electronic component upstream of the digital filter circuit. Further, p denotes the number of data points or rather samples per time interval, for example the number of data points or rather samples per clock cycle. Accordingly, p denotes the number of samples of the respective signal that are processed in parallel (in each channel) by an electronic component upstream of the digital filter circuit.

In some embodiments, i may be a power of 2, i.e. $i=2^I$, with I being an integer that is greater than or equal to 0. In some embodiments, i may be equal to 1, 2, 4, or 8. However, i may also be an integer greater than 8. For example, i may be equal to 16, such that up to 16 signal channels are provided.

Moreover, p may be a power of 2, i.e. $p=2^P$, with P being an integer that is greater than or equal to 0. In some embodiments, p may be equal to 1, 2, 4, 8, 16, 32, 64, or 128. However, p may also be an integer greater than 128.

According to a further aspect of the present disclosure, the product of i and p is, for example, constant between the different configurations. This corresponds to the sum of I and P being constant. Accordingly, I and P may be subject to the constraint I+P=C, with C being an integer and being constant. Hence, I and P can be selected with the constraint that their sum is always the same, e.g. the constant value C.

As described above, the digital filter circuit may have different operational modes that may be associated with different parallelisms p and with different numbers of channels i. The operational mode may be selected freely, albeit with the constraint described above.

In some embodiments, the parallelism p is greater than or equal to 8, and/or wherein the parallelism of the digital filter circuit is smaller than or equal to 256. Accordingly, the parallelism of the digital filter circuit may be freely set between 8 and 256, for example in powers of 2.

In an embodiment of the present disclosure, the digital filter circuit is configured to selectively deactivate convolution sub-circuits of the convolution circuit. In some embodiments, the digital filter circuit is configured to selectively deactivate one or several sub-sets of convolution sub-circuits.

In some embodiments, the different convolution sub-circuits and/or the different sub-sets of convolution sub-circuits may be activated or deactivated individually. For example, if all channels are active, all convolution sub-circuits and/or all sub-sets may be activated such that all channels can be processed simultaneously, i.e. in parallel.

If, however, one or more channels are inactive (e.g. because no signal is present in the respective channel), the corresponding convolution sub-circuits and/or sub-sets of convolution sub-circuits may be deactivated. This way, the power consumption of the digital filter circuit can be reduced. This is particularly advantageous if the digital filter circuit is used in a mobile electronic device, such as a mobile communication device.

Alternatively or additionally to deactivating convolution sub-circuits or sub-sets of convolution sub-circuits, two or more (sub-sets of) convolution sub-circuits may cooperate in order to process at least one of the input channels with higher parallelism, as described above.

In a further embodiment of the present disclosure, the convolution circuit comprises delay sub-circuits upstream of the convolution sub-circuits. The delay sub-circuits may be configured to delay accumulated blocks of samples associated with the digital input signal set such that different channels and/or different polyphases of the digital input signal set can be consecutively processed by the same and/or different sub-sets of convolution sub-circuits. This way, the digital input signal set can be appropriately processed in a time multiplexing mode of the digital filter circuit and/or with an increased filter length.

The digital filter circuit may be implemented in hardware at least partially, and in some embodiments, implemented completely in hardware. For example, the pre-adder circuit, the convolution circuit, and/or the post-adder circuit may comprise one or several ASICs and/or FPGAs that are configured to perform the functionality described in the present disclosure. Accordingly, the digital filter circuit can process the digital input signal set at a particularly high data rate due to the implementation of the digital filter circuit in hardware.

Embodiments of the present disclosure further provide an electronic device. In an embodiment, the electronic device comprises a digital filter circuit described in one or more of the embodiments above.

Regarding the advantages and further properties of the electronic device, reference is made to the explanations given above with respect to the digital filter circuit, which also hold for the electronic device and vice versa.

An aspect of the present disclosure provides that the electronic device is established as, for example, a measurement instrument, as a radio frequency (RF) receiver, and/or as a handheld device. For example, the handheld device may be a handheld measurement device or a handheld mobile communication device, such as a smartphone or a communication radio.

According to another aspect of the present disclosure, the electronic device is established as, for example, a digital oscilloscope, as a signal analyzer, or as a spectrum analyzer.

However, it is to be understood that the electronic device may be established as any other electronic device having at least two signal channels.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth above in connection with the appended drawings, where like numerals reference like elements, are intended as a description of various embodiments of the present disclosure and are not intended to represent the only embodiments. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

In the foregoing description, specific details are set forth to provide a thorough understanding of exemplary embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

Figure 1:
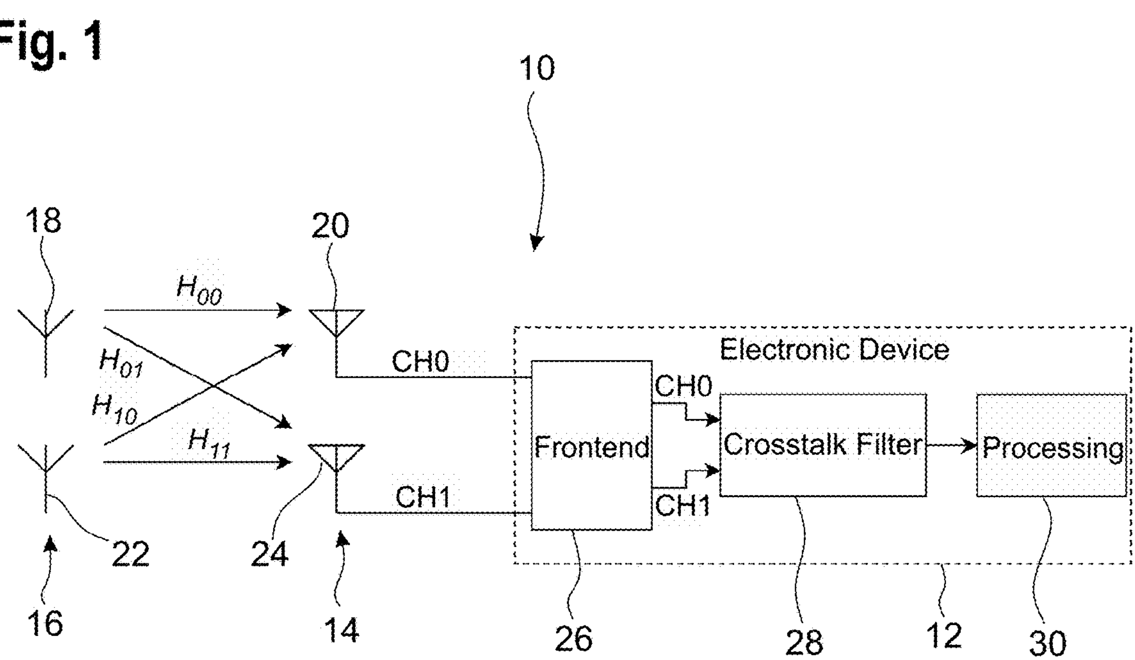
FIG. 1 schematically shows a first embodiment of an electronic signal processing system.

FIG. 1 schematically shows an electronic processing system 10. The electronic processing system 10 comprises an electronic device 12 that is connected to at least two receiver antennas 14. The receiver antennas 14 may either be external receiver antennas or may be integrated into the electronic device 12.

In the embodiment shown in FIG. 1, the electronic device 12 is configured as a radio frequency (RF) receiver or as a measurement instrument with an RF receiver. For example, the electronic device 12 may be established as a digital oscilloscope, a spectrum analyzer, or as a signal analyzer. However, the electronic device 12 may be established as any other electronic device that is configured to receive RF signals by at least two different channels. For example, the electronic device 12 may be a mobile communication device, such as a smartphone or a mobile radio.

In general, the electronic device 12 is configured to receive and process signals from at least two transmitter antennas 16 via the at least two receiver antennas 14. Without restriction of generality, the representative case of the electronic processing system 10 comprising two receiver antennas and two transmitter antennas 16 is described in the following.

In the representative embodiment shown in FIG. 1, the electronic device 12 comprises a first channel CH0 and a second channel CH1 that are associated with a first signal and a second signal transmitted by the at least two transmitter antennas 16, respectively. A first transmitter antenna 18 of the at least two transmitter antennas 16 transmits a first wanted signal to a first receiver antenna 20 of the at least two receiver antennas 14, as indicated by the transfer function $H_{00}$. The first wanted signal is associated with the first channel CH0. A second transmitter antenna 22 of the at least two transmitter antennas 16 transmits a second wanted signal to a second receiver antenna 24 of the at least two receiver antennas 14, as indicated by the transfer function $H_{11}$. The second wanted signal is associated with the second channel CH1.

The first and second wanted signals are forwarded to an RF frontend 26 of the electronic device 12. The RF frontend 26 converts the received signals to a respective intermediate frequency (IF) signal that is appropriate for processing by electronic components of the electronic device 12 downstream of the RF frontend 26. It is noted that while the RF frontend 26 is illustrated as being integrated in the electronic device 12 in FIG. 1, the RF frontend 26 may also be established as an external RF frontend that is connected to the electronic device 12.

Perturbations may be present in the electronic processing system 10. In some embodiments, there usually is crosstalk between the first wanted signal and the second wanted signal received by the first receiver antenna 20 and the second receiver antenna 24, respectively. For example, the first receiver antenna 20 may also receive portions of the second wanted signal, as is indicated by the transfer function $H_{10}$. Likewise, the second receiver antenna 24 may also receive portions of the first wanted signal, as is indicated by the transfer function $H_{01}$.

In order to reduce or even eliminate the crosstalk between the first channel CH0 and the second channel CH1, the signals processed in the two channels CH0, CH1 are filtered by a digital filter circuit 28.

In some embodiments, the term "circuit" refers to or includes, inter alia, a combination of hardware (e.g. a processor such as an integrated circuit, digital circuits or other circuitry) and software (e.g. machine- or processor-executable instructions, commands, or code such as firmware, programming, or object code). Furthermore, a combination of hardware and software may include hardware only (i.e. a hardware element with no software elements), software hosted at hardware (e.g. software that is stored at a memory and executed or interpreted at a processor), or hardware with the software hosted thereon. In some embodiments, the hardware may, inter alia, comprise a CPU, a GPU, an FPGA, an ASIC, or other types of electronic circuitry.

In general, the digital filter circuit 28 is configured to remove unwanted signal portions from the respective channels by appropriately filtering the IF signals provided by the frontend 26. In other words, the digital filter circuit 28 may be established as a crosstalk compensation filter. The functionality of the digital filter circuit 28 will be described in more detail below.

Output signals of the digital filter circuit 28 are forwarded to a processing circuit 30 of the electronic device 12 for further processing, for example for further analysis.

Figure 2:
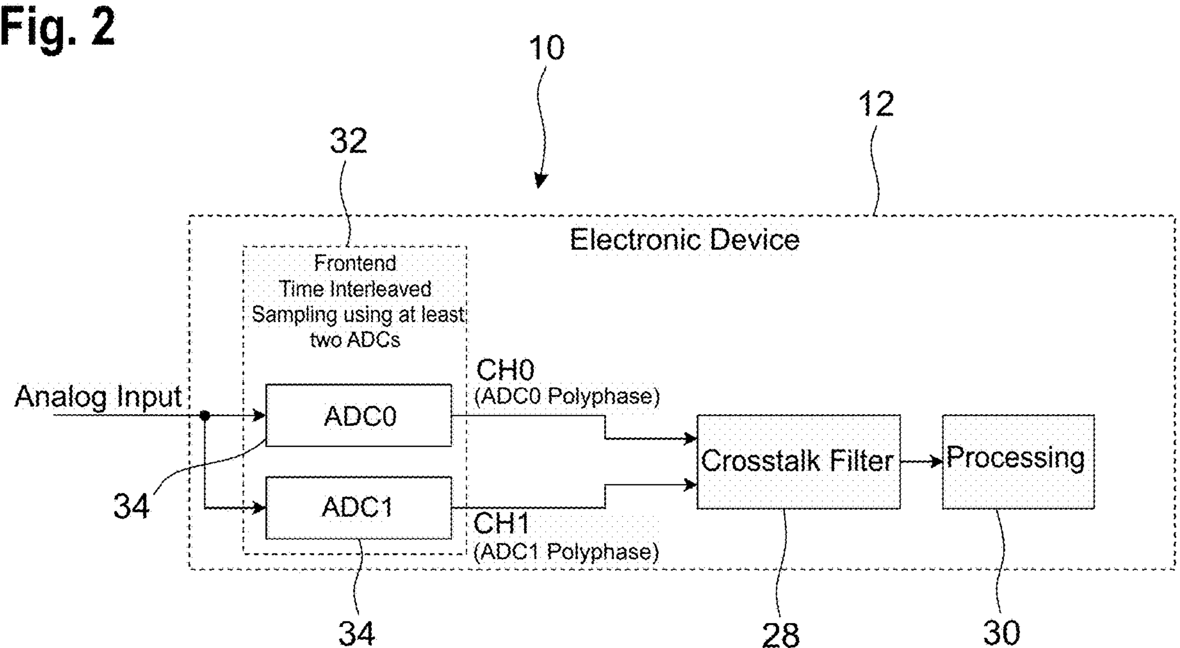
FIG. 2 schematically shows a second embodiment of an electronic signal processing system.

FIG. 2 shows a second embodiment of the electronic processing system 10. In the following, devices and components having a similar functionality are labeled with the same reference numerals as in the first embodiment described above. In the embodiment shown in FIG. 2, the electronic device 12 is configured to receive and process at least one analog input signal. Like described above, the electronic device 12 may be established as a digital oscilloscope, as a signal analyzer, as a spectrum analyzer, or as another type of electronic device.

The electronic device 12 comprises a digitizer circuit 32 with at least two analog-to-digital converters (ADCs) 34. In general, the digitizer circuit 32 is configured to digitize the received analog input signal.

In order to enhance the sampling rate, the at least two ADCs 34 may be configured to digitize the received analog input signal by a time-interleaved sampling technique. As a result, several polyphases associated with the received analog input signal are provided, wherein the polyphases are labelled as "ADC0 polyphase" and "ADC1 polyphase" in FIG. 2.

The different polyphases correspond to different channels CH0, CH1, wherein each polyphase corresponds to a digitized version of the analog input signal. However, the sampling points associated with the different polyphases, i.e. the different channels, are time-shifted compared to each other, such that an increased effective sampling rate is provided.

In the example shown in FIG. 2, the effective sampling rate is double the sampling rate of each of the individual ADCs 34, provided that the ADCs 34 have the same sampling rate.

Similar to the first embodiment described above, the different polyphases may be inadvertently correlated with each other, such that there is crosstalk between the different polyphases. Accordingly, the output signals provided by the ADCs 34 may be filtered by the digital filter circuit 28 that is established as a crosstalk compensation filter.

The digital filter circuit 28 removes unwanted signal portions from the respective polyphases (i.e. the respective channels) by appropriately filtering the output signals provided by the ADCs 34, thereby reducing or even eliminating crosstalk between the polyphases.

Output signals of the digital filter circuit 28 are forwarded to a processing circuit 30 of the electronic device 12 for further processing, for example for further analysis.

Figures 3, 4:
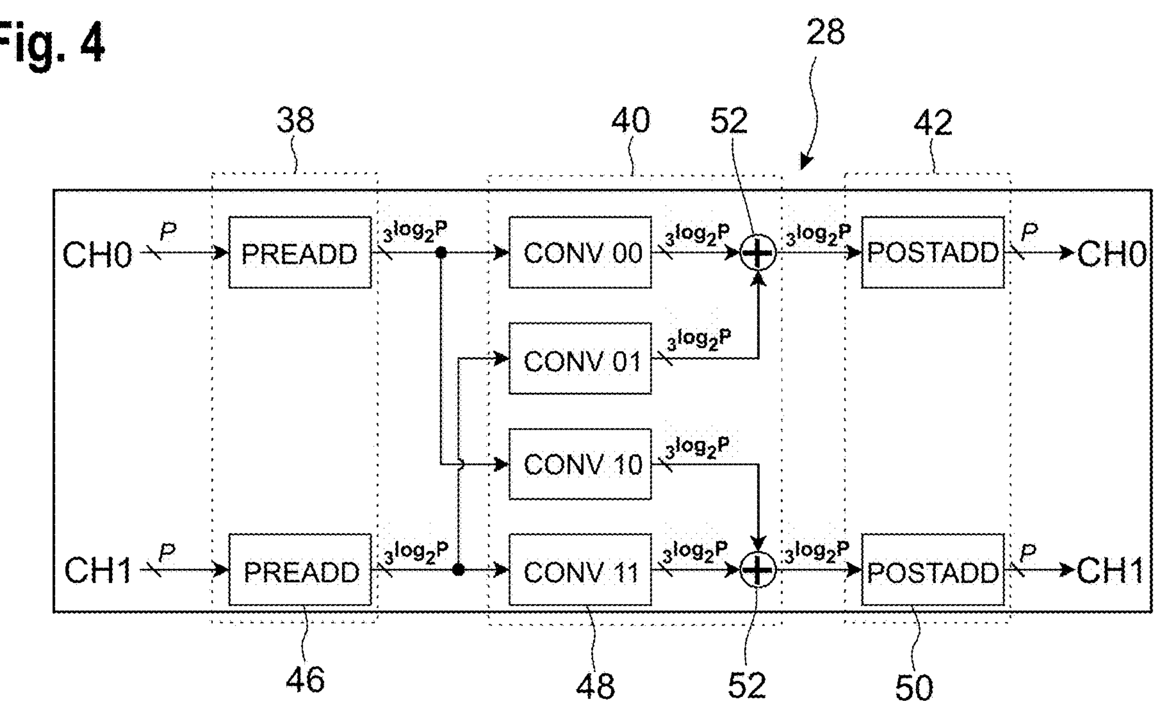
FIG. 3 schematically shows a high level block diagram of a digital filter circuit from the state of the art.
FIG. 4 schematically shows a high level block diagram of a digital filter circuit according to an embodiment of the present disclosure.

FIG. 3 shows in more detail a digital filter circuit being established as a crosstalk compensation filter 36 known from the state of the art. The crosstalk compensation filter 36 comprises a pre-adder circuit 38, a convolution circuit 40, and a post-adder circuit 42. The crosstalk compensation filter 36 comprises four filter sub-circuits 44, wherein each filter sub-circuit 44 comprises a pre-adder sub-circuit 46 associated with the pre-adder circuit 38, a convolution sub-circuit 48 associated with the convolution circuit 40, and a post-adder sub-circuit 50 associated with the post-adder circuit 42.

The digital filter circuit 28 may be implemented in hardware at least partially, and completely in some embodiments. For example, the pre-adder circuit 38, the convolution circuit 40, and/or the post-adder circuit 42 may comprise one or several ASICs and/or FPGAs that are configured to perform the functionality described in the present disclosure.

Each of the filter sub-circuits is, for example, established as a short-length finite impulse response (SFIR) filter. The four filter sub-circuits 44 filter and recombine signals associated with the first channel CH0 and with the second channel CH1 such that crosstalk between the channels CH0, CH1 is reduced or even completely removed.

As is illustrated in FIG. 3, signals associated with the first channel CH0 and with the second channel CH1 are split up and processed by the four filter sub-circuits 44. After processing, the output signals of the four filter sub-circuits 44 are recombined by adder sub-circuits 52 downstream of the post-adder circuit 42.

As is further indicated in FIG. 3, the signals associated with the first channel CH0 and with the second channel CH1 each have a parallelism $p=2^P$, which indicates the number of samples that are to be processed in parallel in each channel is equal to $2^P$.

Therein, P is an integer that is bigger than or equal to 0. For example, P may be equal to 0, 1, 2, 3, 4, 5, 6, or 7. However, P may also be greater than 7.

In general, the complexity of crosstalk compensation filters rises quadratically with the number of channels or with the number of different polyphases. Moreover, the complexity of crosstalk compensation filters also rises with the parallelism P of the signals to be processed in each channel.

Accordingly, crosstalk compensation filters become increasingly more expensive with higher number of channels and with higher parallelism.

As the digital filter circuit 28 shown in FIG. 3 is established as a SFIR filter, the necessary number of multiplier sub-circuits can be reduced significantly compared to other conventional crosstalk compensation filters known from the state of the art, for example if the parallelism p is large.

It has turned out that the number of necessary multiplier sub-circuits can be reduced by 50% or even more compared to other conventional crosstalk compensation filters known from the state of the art.

However, the reduced number of multiplier sub-circuits comes at the cost of an increased number of necessary adder sub-circuits. For example, the number of necessary adder sub-circuits may be increased by up to 30% or even more.

FIG. 4 schematically shows the digital filter circuit 28 according to an embodiment of the present disclosure. The differences compared to the filter describe above with reference to FIG. 3 are indicated by the dotted lines in FIG. 3.

Compared to the embodiment shown in FIG. 3, the overall number of adder sub-circuits of the pre-adder circuit 38 and the overall number of adder sub-circuits of the post-adder circuit 42 is reduced, as will be described in more detail below.

The overall number of adder sub-circuits of the digital filter circuit 28 may be reduced by 50% or more compared to the filter shown in FIG. 3. In some embodiments, the overall number of adder sub-circuits of the digital filter circuit 28 may even be reduced by 80% or more.

The overall number of multiplier sub-circuits may be the same as in the filter shown in FIG. 3. More precisely, for a maximum number of k channels, the digital filter circuit 36 of FIG. 3 comprises $k^2$ pre-adder sub-circuits 46, while the digital filter circuit 28 of FIG. 4 comprises only k pre-adder sub-circuits 46. Likewise, the digital filter circuit 36 of FIG. 3 comprises $k^2$ post-adder sub-circuits 50, while the digital filter circuit 28 of FIG. 4 comprises only k post-adder sub-circuits 46.

The overall number of necessary adder sub-circuits scales with the overall number of pre-adder sub-circuits 46 and with the overall number of post-adder sub-circuits 50. However, the overall number of necessary adder sub-circuits further depends on the length of the digital filter circuit and on the maximum parallelism of the digital input signal set that is to be processed in the k channels.

The digital filter circuit 28 of FIG. 4 provides a common pre- and post-processing due to a modified architecture of the digital filter circuit 28, which allows for reducing the overall number of adder sub-circuits compared to the digital filter circuit of FIG. 3.

For example, compared to the digital filter circuit of FIG. 3, the adder sub-circuits provided downstream of the post-adder sub-circuits 50 are shifted into the convolution circuit 40. The adder sub-circuits 52 are provided downstream of the convolution sub-circuits 48, and upstream of the post-adder sub-circuits 50 of the post-adder circuit 42. Each adder sub-circuit 52 is connected to two convolution sub-circuits 48, such that the adder sub-circuits 52 each are configured to add the output signals of two of the convolution sub-circuits 48.

Due to this different architecture, the digital filter circuit 28 may be configured such that recurring pre- and post-processing steps are performed jointly by the digital filter circuit 28. In other words, the pre-adder circuit 38 is not dedicated to pre-processing only, but may also take over certain post-processing tasks. Likewise, the post-adder circuit 42 is not dedicated to post-processing only, but may also take over certain pre-processing tasks.

For a number k of input channels, the overall number of convolution sub-circuits 48 is $k^2$. For example, for each channel, one convolution sub-circuit 48 is provided that is associated with mapping the respective channel onto itself. In the example shown in FIG. 4, these are the convolution sub-circuits 48 labeled with “CONV00” and “CONV11”. Moreover, for each channel, (k−1) convolution sub-circuits 48 are provided that are associated with reducing the cross talk of that channel with all other channels. Thus, the overall number of convolution sub-circuits 48 is $k*k=k^2$.

Accordingly, the convolution sub-circuits 48 can be grouped into k sub-sets of k convolution sub-circuits 48 per sub-set, wherein each sub-set is associated with one of the input channels.

In the example shown in FIG. 4, i.e. for k=2, there are two sub-sets of convolution sub-circuits 48 for the two channels CH0 and CH1. A first sub-set comprises the convolution sub-circuits 48 “CONV00” and “CONV10”, wherein the first sub-set is associated with the first input channel CH0. A second sub-set comprises the convolution sub-circuits 48 “CONV11” and “CONV01”, wherein the second sub-set is associated with the second input channel CH1.

Figure 5:
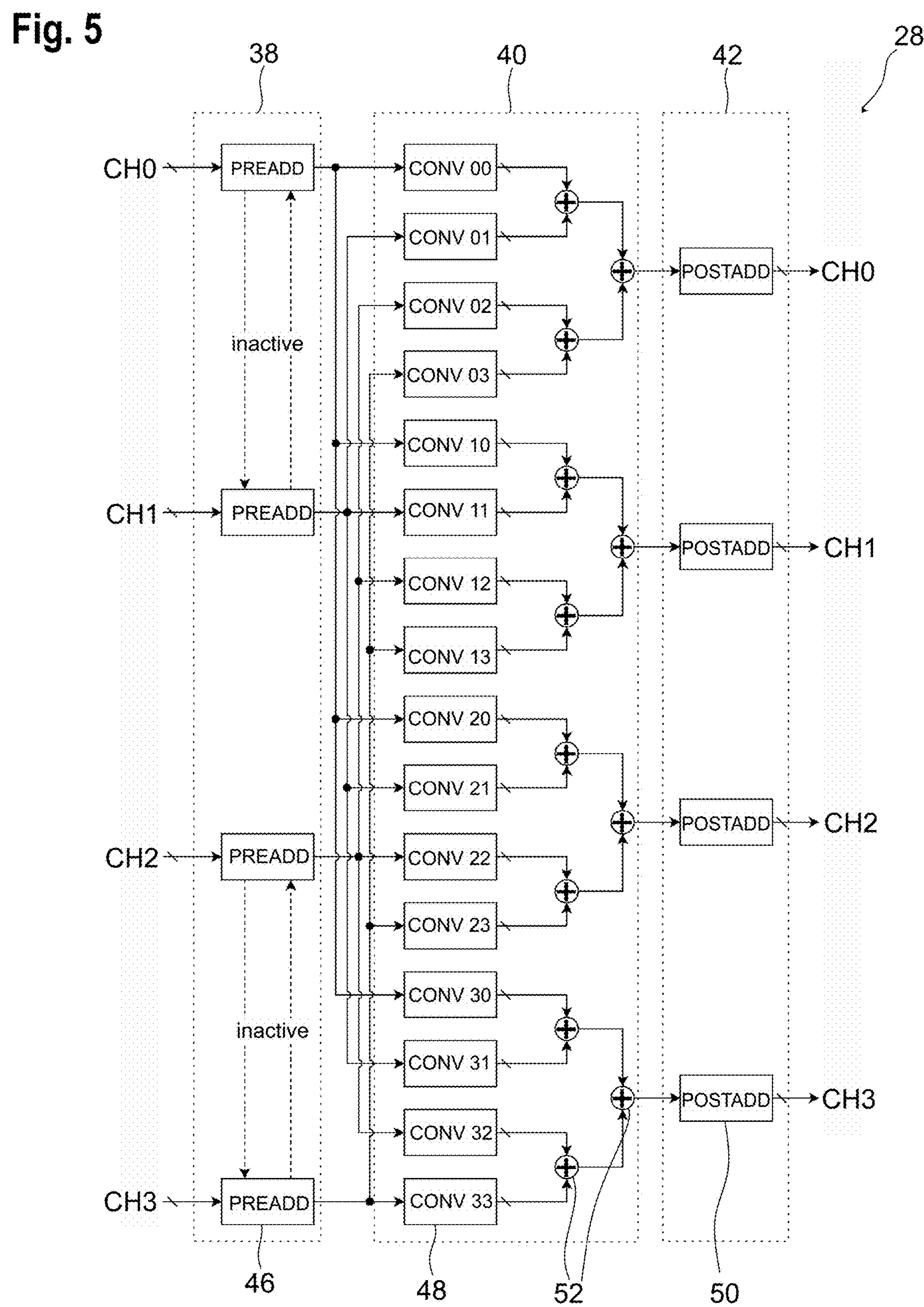
FIG. 5 shows a more detailed block diagram of the digital filter circuit of FIG. 4 in a first operational mode of the digital filter circuit.

FIG. 5 shows the digital filter circuit 28 of FIG. 4 for four input channels CH0, CH1, CH3, CH4, i.e. for k=4.

In this case, the pre-adder circuit 38 comprises four pre-adder sub-circuits 46, the post-adder circuit 42 comprises four post-adder sub-circuits 50, and the convolution circuit 40 comprises $4^2=16$ convolution sub-circuits 48. Accordingly, the convolution sub-circuits 48 are grouped into four sub-sets, wherein each of the sub-sets is associated with one of the input channels, respectively.

For example, the convolution sub-circuits “CONV00”, “CONV10”, “CONV20”, and “CONV30” are associated with the first input channel CH0, the convolution sub-circuits “CONV01”, “CONV11”, “CONV21”, and “CONV31” are associated with the second input channel CH1, etc.

In some embodiments, FIG. 5 shows a possible operational mode of several different operational modes of the digital filter circuit 28.

In this operational mode, each of the input channels is active, i.e. all input channels carry a signal to be processed by the digital filter circuit 28. In this case, all input channels are processed by the different sub-sets of convolution sub-circuits in parallel with the predefined parallelism p of the digital input signal set.

Figure 6:
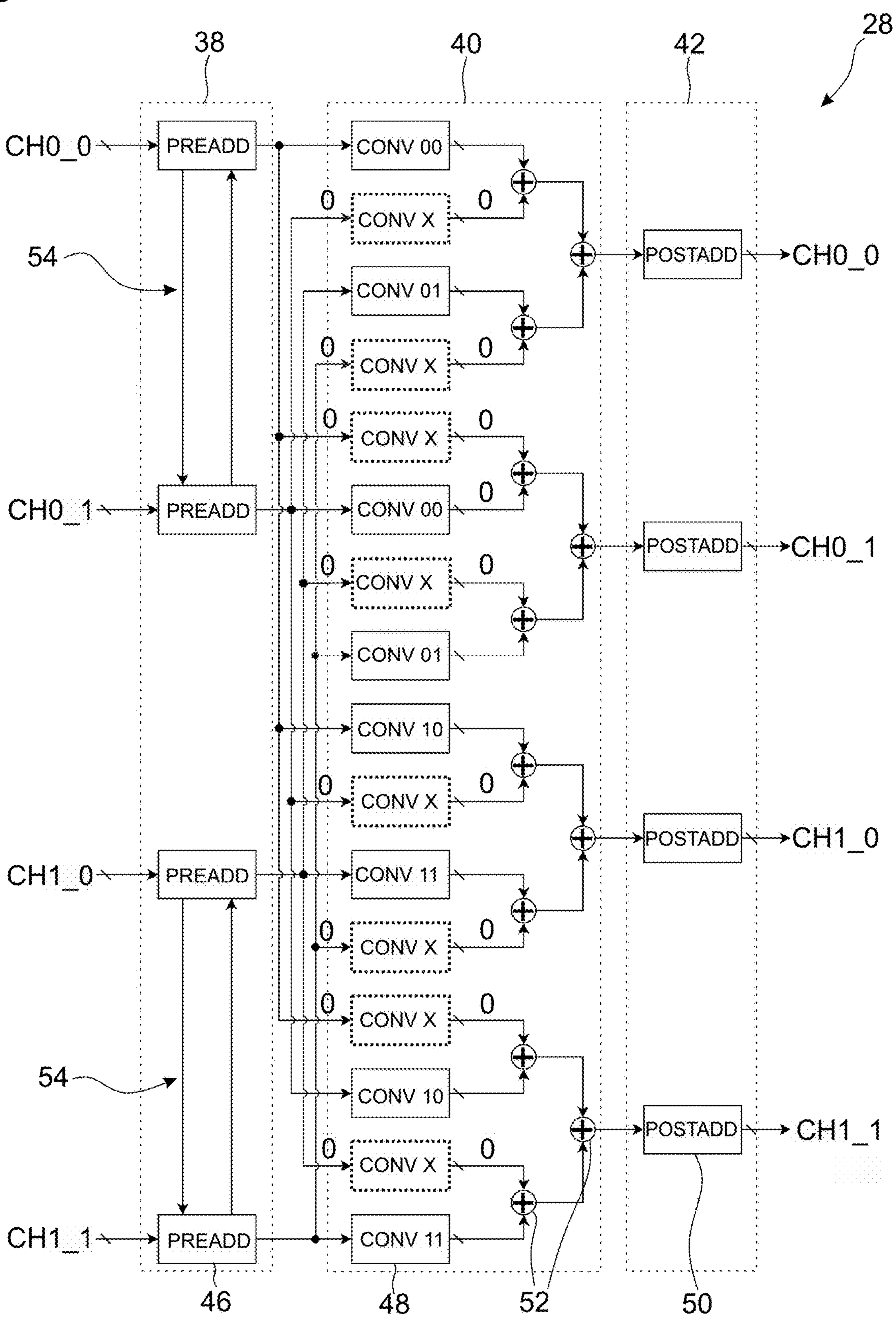
FIG. 6 shows a more detailed block diagram of the digital filter circuit of FIG. 4 in a second operational mode of the digital filter circuit.

FIG. 6 shows a further operational mode of the digital filter circuit 28. In this operational mode, the number of channels is reduced in exchange for an increase of the parallelism of the digital filter circuit 28. In the particular example shown in FIG. 6, the number of channels is reduced from four channels to two channels, i.e. the number of input channels to be processed is halved.

Therein, each channel may carry one or two polyphases, as is indicated by the indices “0_0”, “0_1”, etc. For example, “CH0_0” corresponds to the first polyphase of the first channel, “CH0_1” corresponds to the second polyphase of the second channel, etc.

The two sub-sets of convolution sub-circuits 48 that are associated with the inactive input channels may be deactivated. Accordingly, eight of the convolution sub-circuits 48 are deactivated, as is indicated by “CONV X” in FIG. 6, and eight of the convolution sub-circuits 48 remain active.

The digital filter circuit 28 may comprise a connection circuit 54 that is configured to selectively connect the pre-adder sub-circuits 46, such that the eight remaining convolution sub-circuits 48 cooperate in processing the two active input channels. It is noted that the connection circuit 54 may also be configured to selectively connect the convolution sub-circuits 48 and/or the post-adder sub-circuits 50. This way, the parallelism of the digital filter circuit 28 can be doubled for processing the two active input channels.

In a further operational mode, even more of the convolution sub-circuits 48 may be deactivated, such that only four convolution sub-circuits remain active in order to save even more energy.

In this operational mode, the active structure of digital filter circuit is effectively reduced to the structure shown in FIG. 4, i.e. two channels are processed by means of four convolution sub-circuits 48.

Figure 7:
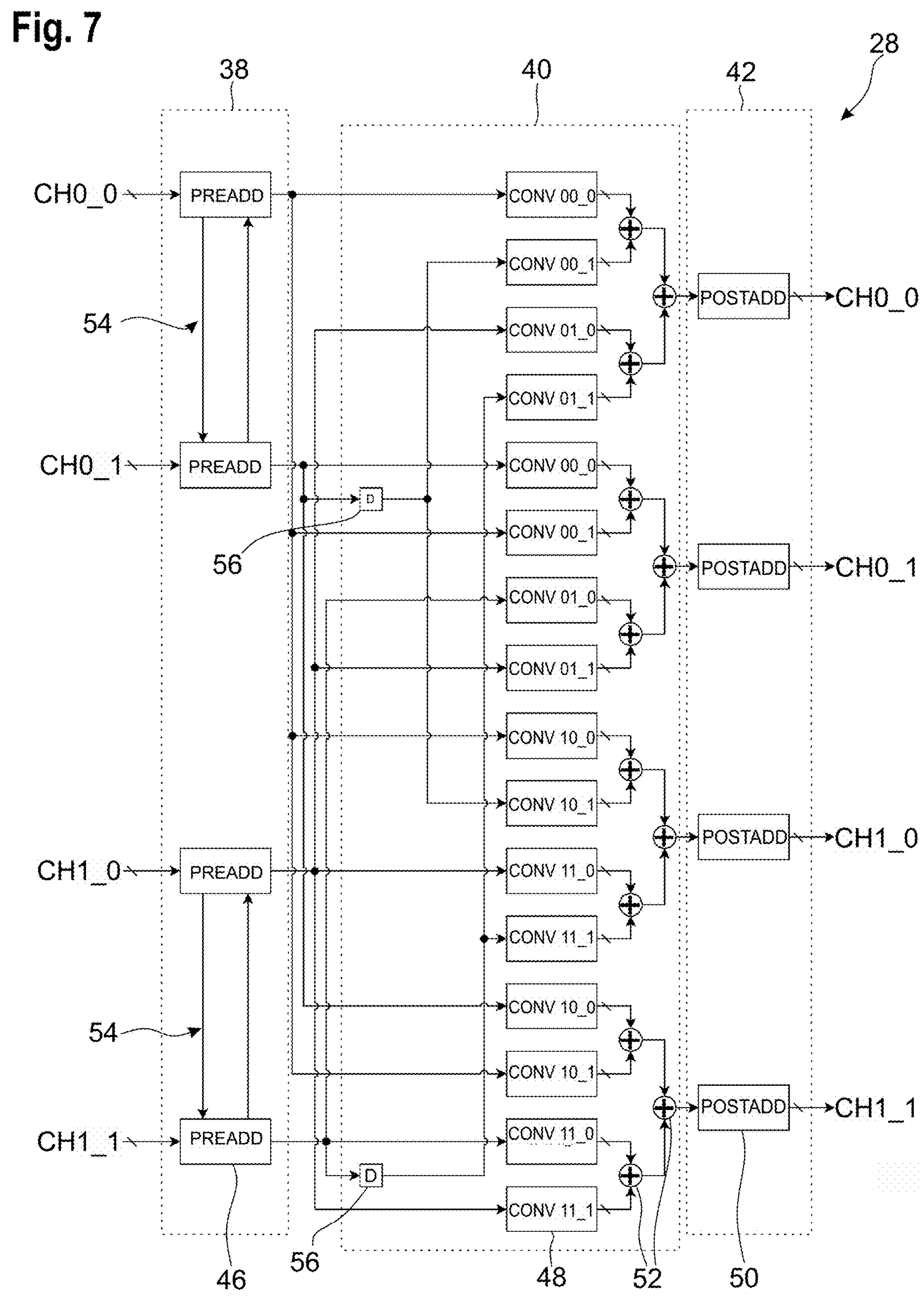
FIG. 7 shows a more detailed block diagram of the digital filter circuit of FIG. 4 in a third operational mode of the digital filter circuit.

FIG. 7 shows a further operational mode of the digital filter circuit 28. In the particular example shown in FIG. 7, the number of channels is reduced from four channels to two channels, i.e. the number of input channels to be processed is halved, wherein each channel may carry two polyphases.

However, the two sub-sets of convolution sub-circuits 48 that are associated with the inactive input channels are not deactivated, but remain active. Accordingly, all 16 of the convolution sub-circuits 48 remain active.

The digital filter circuit 28 selectively connects the pre-adder sub-circuits 46, such that the 16 convolution sub-circuits 48 cooperate in processing the two active input channels.

The convolution circuit 40 further comprises delay sub-circuits 56 upstream of the convolution sub-circuits 48. The delay sub-circuit 56 are connected to a certain portion of the convolution sub-circuits 48.

The delay sub-circuits 56 may be configured to delay accumulated blocks of samples associated with the digital input signal set such that different channels and/or different polyphases of the digital input signal set can be consecutively processed by the same and/or different sub-sets of convolution sub-circuits.

This way, the digital input signal set can be appropriately processed in a time multiplexing mode of the digital filter circuit 28 and/or with an increased filter length.

Thus, in this operational mode, the parallelism of the digital filter circuit 28 can be doubled for processing the two active input channels. Moreover, the filter length of the digital filter circuit 28 can be doubled for processing the two active input channels.

The digital filter circuit 28 may be switchable between the different operational modes described above, such that a suitable operational mode can be selected for each parallelism and number of channels of the digital input signal set.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

Throughout this specification, terms of art may be used. These terms are to take on their ordinary meaning in the art from which they come, unless specifically defined herein or the context of their use would clearly suggest otherwise.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An electronic device, comprising:

a digital filter circuit comprising a pre-adder circuit comprising a number of n pre-adder sub-circuits, wherein n is an integer greater than or equal to 2, a convolution circuit comprising a number of m convolution sub-circuits, wherein m is an integer, wherein each convolution sub-circuit is configured to multiply at least one signal with a matrix that corresponds to filter coefficients of the respective convolution sub-circuit, a post-adder circuit comprising a number of k post-adder sub-circuits, wherein k is an integer greater than or equal to 2, wherein the number m of convolution sub-circuits is greater than the number n of pre-adder sub-circuits of the pre-adder circuit, and wherein the number m of convolution sub-circuits is greater than the number k of post-adder sub-circuits of the post-adder circuit.

2. The electronic device of claim 1, wherein the digital filter circuit is established as a finite impulse response (FIR) filter.

3. The electronic device of claim 1, wherein the digital filter circuit is established as a short-length finite impulse response (SFIR) filter.

4. The electronic device of claim 1, wherein the digital filter circuit is a crosstalk compensation filter.

5. The electronic device of claim 1, wherein m is greater than or equal to 4.

6. The electronic device of claim 1, wherein the convolution sub-circuits are allocated to different sub-sets of convolution sub-circuits.

7. The electronic device of claim 6, wherein a number of different sub-sets of convolution sub-circuits corresponds to a number of input channels to be processed.

8. The electronic device of claim 1, wherein the convolution circuit comprises at least one adder sub-circuit, wherein the at least one adder sub-circuit is associated with at least two of the convolution sub-circuits.

9. The electronic device of claim 8, wherein the at least one adder sub-circuit of the convolution circuit is interconnected between the at least two of the convolution sub-circuits associated with the at least one adder sub-circuit of the convolution circuit and the post-adder circuit.

10. The electronic device of claim 8, wherein the at least one adder sub-circuit of the convolution circuit is configured to add output signals of the at least two of the convolution sub-circuits associated with the at least one adder sub-circuit.

11. The electronic device of claim 1, wherein the number m of convolution sub-circuits is equal to the number n of pre-adder sub-circuits of the pre-adder circuit squared.

12. The electronic device of claim 1, wherein the number n of pre-adder sub-circuits of the pre-adder circuit is equal to the number k of post-adder sub-circuits of the post-adder circuit.

13. The electronic device of claim 1, wherein the digital filter circuit is switchable between different configurations, wherein each configuration is associated with a predetermined number i of input channels to be processed and with a predetermined parallelism p, wherein i and p are integers.

14. The electronic device of claim 13, wherein the product of i and p is constant between the different configurations.

15. The electronic device of claim 13, wherein the parallelism p is greater than or equal to 8, and/or wherein the parallelism of the digital filter circuit is smaller than or equal to 256.

16. The electronic device of claim 1, wherein the digital filter circuit is configured to selectively deactivate convolution sub-circuits of the convolution circuit.

17. The electronic device of claim 1, wherein the convolution circuit comprises delay sub-circuits upstream of the convolution sub-circuits.

18. The electronic device of claim 1, wherein the electronic device is established as a measurement instrument, as a radio frequency (RF) receiver, and/or as a handheld device.

19. The electronic device of claim 18, wherein the electronic device is established as a digital oscilloscope, as a signal analyzer, or as a spectrum analyzer.

* * * * *